(12) United States Patent
Wood et al.

(10) Patent No.: US 9,356,141 B2
(45) Date of Patent: May 31, 2016

(54) SEMICONDUCTOR DEVICE HAVING PERIPHERAL TRENCH STRUCTURES

(71) Applicant: Infineon Technologies AG, Neubiberg (DE)

(72) Inventors: Andrew Christopher Graeme Wood, St. Jakob im Rosental (AT); Oliver Blank, Villach (AT); Martin Poelzl, Ossiach (AT); Martin Vielemeyer, Villach (AT)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 14/447,896

(22) Filed: Jul. 31, 2014

(65) Prior Publication Data

US 2015/0041816 A1 Feb. 12, 2015

(30) Foreign Application Priority Data

Aug. 7, 2013 (DE) .......................... 10 2013 108 518

(51) Int. Cl.
| | | |
|---|---|---|
| *H01L 27/11* | (2006.01) | |
| *H01L 29/04* | (2006.01) | |
| *H01L 29/78* | (2006.01) | |
| *H01L 29/66* | (2006.01) | |
| *H01L 27/115* | (2006.01) | |
| *H01L 29/423* | (2006.01) | |
| *H01L 29/8605* | (2006.01) | |
| *H01L 29/861* | (2006.01) | |
| *H01L 29/16* | (2006.01) | |
| *H01L 29/20* | (2006.01) | |

(52) U.S. Cl.
CPC ............ *H01L 29/7827* (2013.01); *H01L 29/04* (2013.01); *H01L 29/66666* (2013.01); *H01L 29/7803* (2013.01); *H01L 29/7804* (2013.01); *H01L 29/7811* (2013.01); *H01L 29/7813* (2013.01); *H01L 27/11526* (2013.01); *H01L 29/1608* (2013.01); *H01L 29/2003* (2013.01); *H01L 29/4236* (2013.01); *H01L 29/861* (2013.01); *H01L 29/8605* (2013.01)

(58) Field of Classification Search
CPC ..................... H01L 27/11526; H01L 29/4236; H01L 29/7813
See application file for complete search history.

(56) References Cited

U.S. PATENT DOCUMENTS

| | | | | |
|---|---|---|---|---|
| 4,769,685 | A * | 9/1988 | MacIver et al. ............... | 257/260 |
| 5,233,215 | A * | 8/1993 | Baliga ........................... | 257/490 |
| 6,031,265 | A * | 2/2000 | Hshieh .......................... | 257/334 |
| 7,034,359 | B2 * | 4/2006 | Harada .......................... | 257/330 |

(Continued)

FOREIGN PATENT DOCUMENTS

| | | |
|---|---|---|
| DE | 10234996 A1 | 10/2003 |
| DE | 10350684 A1 | 6/2005 |

*Primary Examiner* — Ida M Soward
(74) *Attorney, Agent, or Firm* — Eschweiler & Associates, LLC

(57) ABSTRACT

The disclosure relates to a semiconductor device including a semiconductor body, having a first surface, a gate electrode structure, which includes polycrystalline silicon, of an IGFET in a first trench extending from the first surface into the semiconductor body. The device also includes a semiconductor element, which is different from the gate electrode structure of the IGFET and includes polycrystalline silicon, in a second trench extending from the first surface into the semiconductor body, wherein the polycrystalline silicon of the IGFET and of the semiconductor element different therefrom ends below a top side of an insulation layer adjoining the first surface of the semiconductor body.

17 Claims, 16 Drawing Sheets

(56) References Cited

U.S. PATENT DOCUMENTS

| | | | |
|---|---|---|---|
| 7,414,278 B2* | 8/2008 | Sugatani | H01L 21/76229 257/296 |
| 7,579,650 B2* | 8/2009 | Cao et al. | 257/333 |
| 8,008,711 B2* | 8/2011 | Takahashi | 257/327 |
| 8,222,693 B2* | 7/2012 | Koops et al. | 257/335 |
| 8,399,925 B2* | 3/2013 | Wang et al. | 257/341 |
| 8,410,546 B2* | 4/2013 | Kawaguchi et al. | 257/330 |
| 8,742,456 B2* | 6/2014 | Akiyama et al. | 257/170 |
| 8,841,697 B2* | 9/2014 | Mizushima | 257/109 |
| 8,896,047 B2* | 11/2014 | Wood et al. | 257/302 |
| 8,907,416 B2* | 12/2014 | Tai et al. | 257/331 |
| 9,111,764 B2* | 8/2015 | Hirler et al. | |
| 2004/0191994 A1* | 9/2004 | Williams et al. | 438/270 |
| 2005/0145936 A1* | 7/2005 | Polzl et al. | 257/341 |
| 2005/0280029 A1* | 12/2005 | Nakamura et al. | 257/192 |
| 2006/0118864 A1* | 6/2006 | Hirler et al. | 257/335 |
| 2008/0001217 A1* | 1/2008 | Kawashima | 257/330 |
| 2008/0048251 A1* | 2/2008 | Disney et al. | 257/330 |
| 2008/0073710 A1* | 3/2008 | Yamamoto | 257/334 |
| 2009/0090967 A1* | 4/2009 | Chen et al. | 257/330 |
| 2009/0140330 A1* | 6/2009 | Yagi et al. | 257/330 |
| 2009/0294870 A1* | 12/2009 | Arai et al. | 257/378 |
| 2010/0123189 A1* | 5/2010 | Venkatraman et al. | 257/330 |
| 2010/0123193 A1* | 5/2010 | Burke et al. | 257/334 |
| 2010/0187605 A1 | 7/2010 | Haeberlen et al. | |
| 2010/0207206 A1* | 8/2010 | Krischke et al. | 257/337 |
| 2011/0121386 A1* | 5/2011 | Hsieh | 257/334 |
| 2013/0168765 A1* | 7/2013 | Lin et al. | 257/334 |
| 2013/0248992 A1* | 9/2013 | Padmanabhan | H01L 29/41766 257/331 |
| 2014/0374823 A1* | 12/2014 | Bhalla et al. | 257/334 |
| 2015/0008516 A1* | 1/2015 | Lemke | H01L 21/823437 257/331 |
| 2015/0097262 A1* | 4/2015 | Mauder et al. | 257/493 |

\* cited by examiner

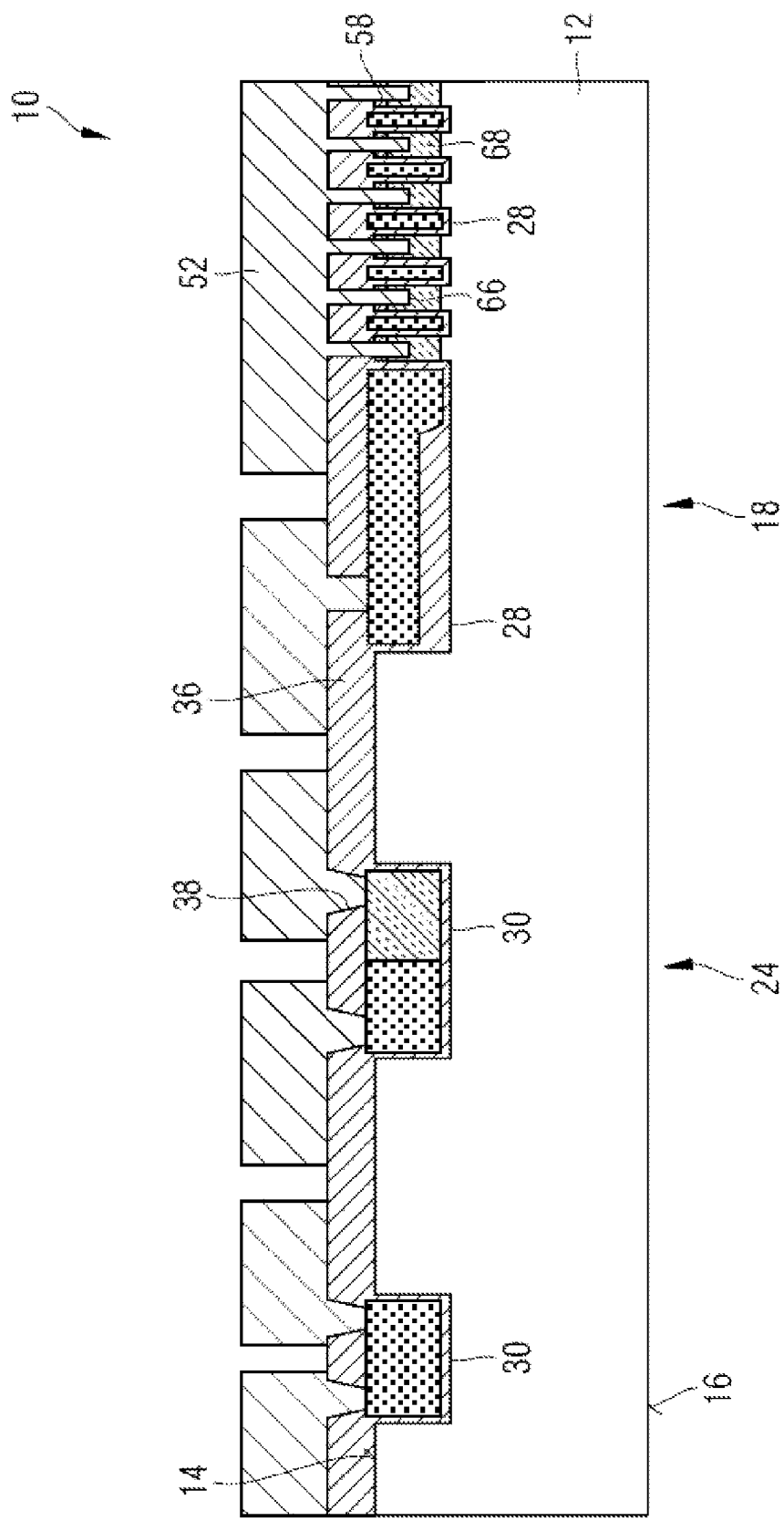

SEMICONDUCTOR DEVICE HAVING PERIPHERAL TRENCH STRUCTURES

REFERENCE TO RELATED APPLICATION

This application claims priority to German application No. 10 2013 108 518.0 filed on Aug. 7, 2013.

BACKGROUND

When producing field effect transistors (FETs) having an insulated gate (IGFETs) for power semiconductor components, in the case of which the gate electrode structure is arranged within a trench, in combination with further semiconductor components such as, for example, diodes, resistors, capacitors or sensor structures, a multiplicity of mask steps are used for production and patterning. This involves using different mask steps on the patterning of polycrystalline silicon regions for the different components or gate structures. It is therefore desirable to reduce the complexity of the process for producing a power semiconductor component in which an IGFET structure and further semiconductor components are integrated.

SUMMARY

In accordance with one example embodiment, a semiconductor device, comprises a semiconductor body, having a first surface, a gate electrode structure, which comprises polycrystalline silicon, of an IGFET in a first trench extending from the first surface into the semiconductor body. The device further comprises a semiconductor element, which is different from the gate electrode structure of the IGFET and comprises polycrystalline silicon, in a second trench extending from the first surface into the semiconductor body. In this case, the polycrystalline silicon of the IGFET and of the semiconductor element different therefrom ends below a top side of an insulation layer adjoining the first surface of the semiconductor body.

In accordance with a further example embodiment, a method for producing a gate electrode structure of an IGFET and of a semiconductor element, which is different from the gate electrode structure of the IGFET, in a semiconductor device is disclosed. The method comprises forming a first trench for the gate electrode structure of the IGFET and a second trench for the semiconductor element in a semiconductor body, and applying polycrystalline silicon on the surface of the semiconductor body until the first trench and the second trench are filled. The method further comprises carrying out a chemical mechanical polishing step in order to remove polycrystalline silicon present above the first trench and the second trench, such that the polycrystalline silicon of the gate electrode structure in the first trench and the polycrystalline silicon of the semiconductor element in the second trench are separated from one another.

The person skilled in the art will recognize additional features and advantages after reading the following detailed description and examining the accompanying drawings.

BRIEF DESCRIPTION OF THE DRAWINGS

The accompanying drawings are enclosed in order to afford a further understanding of the example embodiments of the disclosure, and they are included in the disclosure and form a part thereof. The drawings illustrate example embodiments of the present disclosure and together with the description serve for explaining the principles of the disclosure. Other example embodiments of the disclosure and numerous intended advantages will be recognized immediately since they will be better understood with reference to the following detailed description.

DETAILED DESCRIPTION

In the following detailed description, reference is made to the accompanying drawings, which form a part of the disclosure and which show, for illustration purposes, specific example embodiments in which the disclosure can be implemented. It should be taken into consideration that other example embodiments can be employed and structural or logical changes can be made, without departing from the scope of protection of the present disclosure. By way of example, features illustrated or described as part of one example embodiment can be used together with other example embodiments in order to arrive at a further example embodiment. The intention is for the present disclosure to include such modifications and variations. The examples are described using a specific language which should not be interpreted as limiting the scope of the accompanying patent claims. The drawings are not true to scale and serve merely for illustration purposes. For the sake of clarity, the same elements or production processes are provided with the same reference signs in the various drawings, unless stated otherwise.

Terms such as "have", "contain", "encompass", "comprise" and similar terms are open terms, this is to say that further elements or features can be present alongside the "encompassed terms". Elements identified by definite and indefinite articles can be present both in the singular and in the plural, unless expressly indicated otherwise.

The expression "electrically connected" is intended to describe a low-impedance electrical connection between the elements electrically connected to one another, for example a connection via a metal and/or a highly doped semiconductor. The expression "electrically coupled" is not intended to mean that the elements have to be directly coupled to one another. Moreover, intervening elements can be provided between the "electrically coupled" elements. As an example, none, some or all of the intervening elements can be controllable in order to supply a low-impedance connection and, at a different time, a non-low-impedance connection between the "electrically coupled" elements.

The figures refer to relative doping concentrations by the indication of "−" or "+" next to the doping type. By way of example, "n−" denotes a doping concentration that is lower than the doping concentration of an "n"-type doping region, while an "n+"-type doping region has a higher doping concentration than the "n"-type doping region. Doping regions having the same relative doping concentration can, but need not, have the same absolute doping concentration. By way of example, two different n+-type regions can have different absolute doping concentrations.

Figure 1:
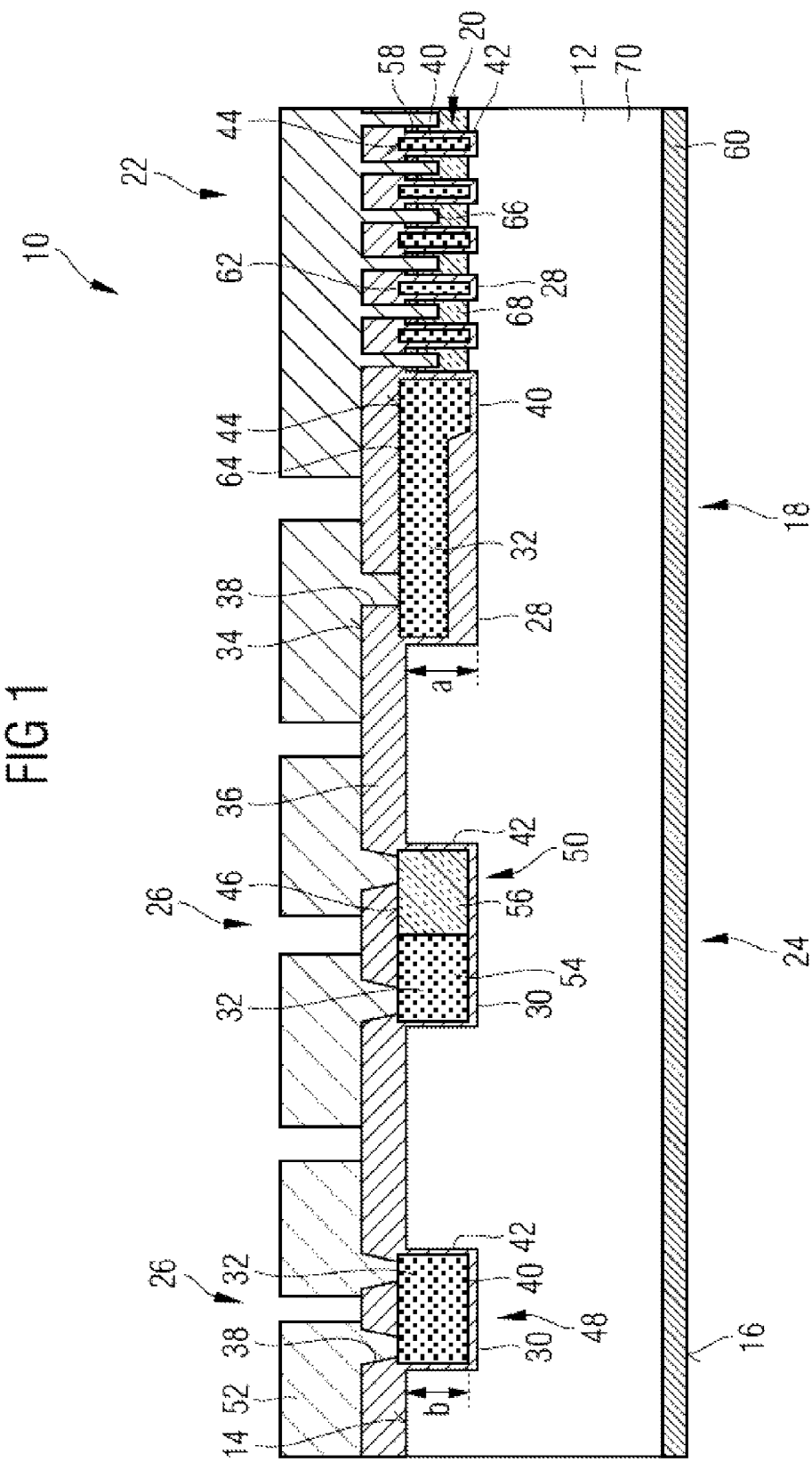
FIG. 1 shows a schematic cross-sectional view of a portion of a semiconductor device comprising a gate electrode structure of a vertical IGFET and further semiconductor elements in accordance with one example embodiment.

FIG. 1 shows a schematic cross-sectional view of a portion of a semiconductor device 10 in accordance with one example embodiment. The semiconductor device 10 comprises a semiconductor body 12, which can comprise a semiconductor substrate. The semiconductor body 12 comprises a semiconductor material such as, for example, silicon (Si), silicon carbide (SiC), germanium (Ge), silicon-germanium (SiGe), gallium nitride (GaN) or gallium arsenide (GaAs). The semiconductor body 12 can comprise one or more optional semiconductor layers such as, for example, epitaxial layers on a semiconductor substrate. Outside the portion shown, the semiconductor body 12 can comprise, inter alia, doped and undoped portions of epitaxial semiconductor layers and further insulation and conduction structures.

The semiconductor body 12 has a first surface 14 and a second surface 16 opposite the first surface 14. The semiconductor device 10 can comprise a first part 18, in which a gate electrode structure 20 of an IGFET 22 is formed, and a second part 24, in which a semiconductor element 26 different from the gate electrode structure 20 of the IGFET 22 is formed. In the following example embodiment, the IGFET 22 is embodied as a vertical IGFET 22, in the case of which a current to be controlled flows between the first surface 14 and the second surface 16. It is also conceivable, to provide as the IGFET 22 a lateral IGFET, in the case of which the gate electrode structure 20 controls a current in a lateral direction. The gate electrode structure 20 of the vertical IGFET 22 in the first part 18 is formed in a first trench 28 extending from the first surface 14 into the semiconductor body 12 in the direction of the second surface 16 orthogonally with respect to the first surface 14. The semiconductor element 26 in the second part 24 of the semiconductor device 10 is formed in a second trench 30 extending from the first surface 14 into the semiconductor 12 in the direction of the second surface 16 orthogonally with respect to the first surface 14. The gate electrode structure 20 of the vertical IGFET 22 and the semiconductor element 26 comprise polycrystalline silicon 32 that ends below a top side 34 of an insulation layer 36 adjoining the first surface 14 of the semiconductor body 12.

In this case, below the top side 34 of the insulation layer 36 should be understood to mean a position which, in terms of its vertical distance, is closer to the second surface 16 than any arbitrary part of the top side 34 of the insulation layer 36. In the case of a planar insulation layer 36 on the first surface 14, the top side 34 is the opposite side of the insulation layer 36 relative to the interface between the insulation layer 36 and the first surface 14. Below the top side 34 of the insulation layer 36 is understood herein to mean a position which lies below the insulation layer 36 or at least within contact holes 38 formed in the insulation layer 36.

In one example embodiment, any polycrystalline silicon 32 of the semiconductor device 10 can end below the top side 34 of the insulation layer 36 adjoining the first surface 14 of the semiconductor body 12. In this case, in the finished semiconductor device 10, no functional polycrystalline silicon is present above the top side 34 of the insulation layer 36, with the exception of pure dummy structures composed of polycrystalline silicon without electrical functionality in the semiconductor device 10. In another example embodiment, the polycrystalline silicon 32 of the vertical IGFET 22 and the semiconductor elements 26 different therefrom can extend maximally as far as the first surface 14 of the semiconductor body 12. In this case, the polycrystalline silicon 32 of the vertical IGFET does not extend beyond the first trench 28 or beyond the second trench 30 in the semiconductor body 12.

The polycrystalline silicon 32 in the first trench 28 and the second trench 30 is surrounded by a dielectric 40 that lines the walls 42 of the first trench 28 and of the second trench 30, in order to electrically insulate the polycrystalline silicon 32 in the first trench 28 and the second trench 30 from the semiconductor body 12. The dielectric 40 can have a different thickness depending on the field of application, as described in even greater detail in the explanation of the production method. The first trench 28 has a depth "a" and the second trench 30 has a depth "b", wherein the depths "a" and "b" deviate from one another maximally by 500 nm, or maximally by 250 nm, and in one particular example, maximally by 100 nm. In this case, the first trench 28 and the second trench 30 can have different widths. In one example embodiment, the polycrystalline silicon 32 of the gate electrode structure 20 of the vertical IGFET 22 in the first trench 28 has a top side 44 that is planar. The top side 44 of the polycrystalline silicon 32 of the gate electrode structure 20 is that surface of the polycrystalline silicon 32, which is opposite relative to the second surface 16 of the semiconductor body 12 and forms an interface with the insulation layer 36. The insulation layer 36 therefore adjoins the polycrystalline silicon 32 in the region of the first trench 28. Planar top side should be understood to mean that all regions of the surface of the polycrystalline silicon 32 which adjoins the insulation layer 36 lie within a common plane. The polycrystalline silicon 32 within the second trench 30 can have a planar top side 46 like the polycrystalline silicon 32 in the first trench 28. In one example embodiment, the polycrystalline silicon 32 in the first trench 28 and in the second trench 30 can therefore each have a planar top side 44, 46, which in one embodiment deviate from one another maximally by 100 nm. In one example embodiment, the planar top sides 44, 46 lie in a common plane.

The semiconductor element 26 in the second trench 30, comprising polycrystalline silicon 32, can be configured as an active or a passive electrical component. In the example embodiment shown in FIG. 1, a resistor 48 and a diode 50 are shown as the semiconductor element 26. For this purpose, the resistor 48 comprises n- or p-doped polycrystalline silicon 32, which is electrically connected to a patterned wiring layer 52 via two contact holes 38 in the insulation layer 36. The polycrystalline silicon 32 is electrically insulated from the semiconductor body 12 by the dielectric 40. Depending on the dopant concentration of the n- or p-doped polycrystalline silicon 32, a highly n- or p-doped contact zone can be formed between the n- or p-doped polycrystalline silicon 32 and the contact holes 38, in order to mediate a low-impedance or ohmic contact. In the case of a diode 50, the polycrystalline silicon 32 is n-doped in a first region 54 and p-doped in a second region 56, wherein the differently doped regions 54, 56 within the second trench 30 form a diode structure. The first region 54 and the second region 56 are electrically connected to the patterned wiring layer 52 in each case via the contact holes 38 in the insulation layer 36. The resistor 48 and the diode 50 are merely examples of the semiconductor element 26. In this regard, it is furthermore possible to provide a transistor, a capacitor or an edge termination structure of the semiconductor device 10 or of the vertical IGFET 22 as the semiconductor element 26.

Figure 2:
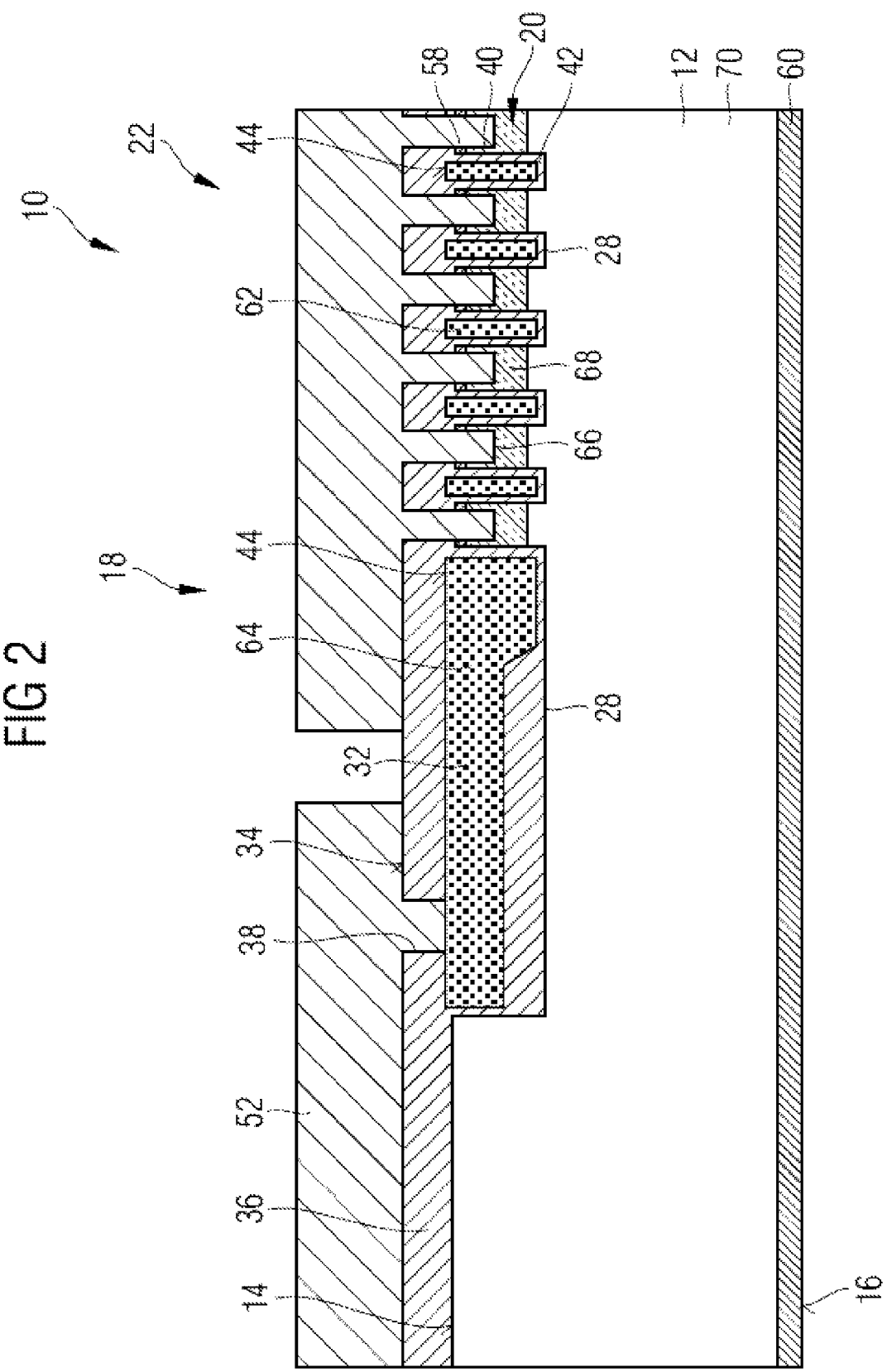
FIG. 2 shows a schematic cross-sectional view of a portion of the semiconductor device comprising the gate electrode structure of a vertical IGFET in accordance with one example embodiment.

The vertical IGFET 22 in the first part 18 of the semiconductor device 10 comprises, besides the gate electrode structure 20, as shown in detail in FIG. 2, source regions 58 of a first charge carrier type, which are formed at the first surface 14 of the semiconductor body 12, and a common drain region 60 of the first charge carrier type, which is formed at the second surface 16 of the semiconductor body 12.

The gate electrode structure 20 comprises at least one gate electrode 62 and a gate electrode contact-making region 64, which is in contact with a conductive layer, with the patterned wiring layer 52 in the example embodiment shown in FIG. 1, below the top side 34 of the insulation layer 36 adjoining the first surface 14 of the semiconductor body 12. The gate electrode contact-making region 64 is formed jointly with the gate electrodes 62 in the first trench 28, as is illustrated by way of example in FIG. 3A.

In one example embodiment, the vertical IGFET 22 differs from a known vertical IGFET in terms of its gate electrode structure. In this case, in the example embodiment shown in FIG. 1, the gate electrode contact-making region 64 firstly serves for making contact with the gate electrodes 62 by means of the patterned wiring layer 52, and secondly is provided as an edge termination structure of the vertical IGFET 22. In this case, the gate electrode contact-making region 64 acting as an edge termination structure encloses the gate electrodes 62 arranged jointly with the gate electrode contact-making region 64 in a continuous first trench 28.

Figure 3:
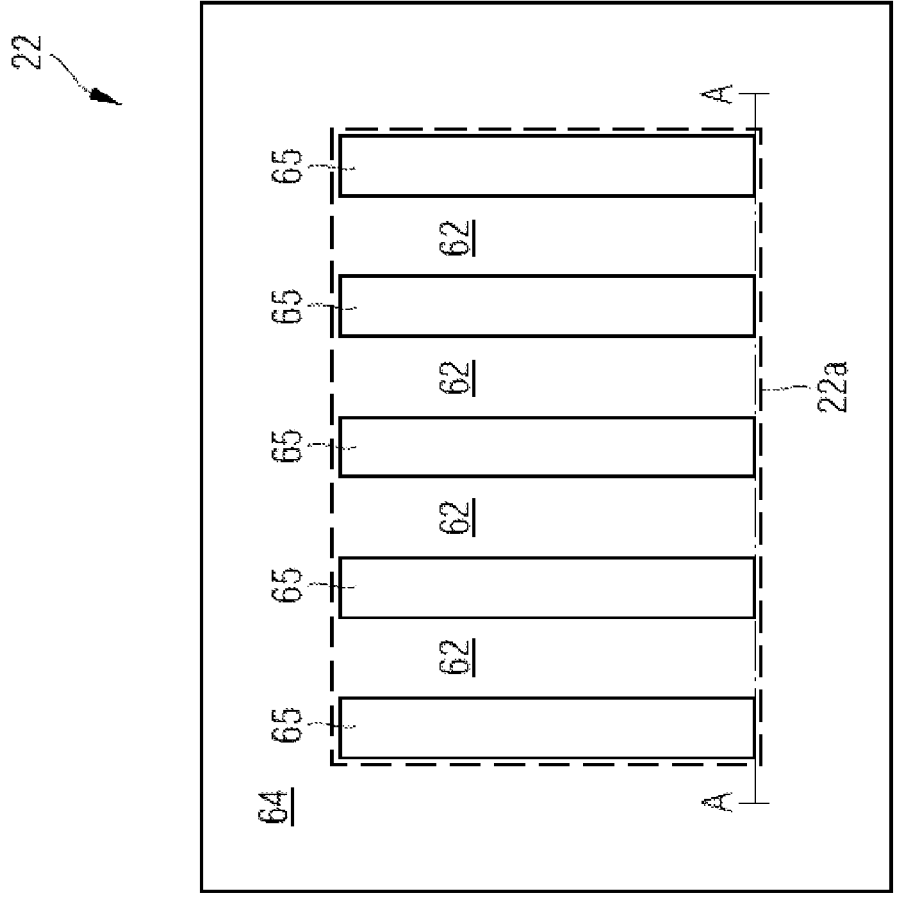
FIG. 3A shows a schematic plan view of a polycrystalline silicon structure of the gate electrode structure of the vertical IGFET of the semiconductor device in accordance with one example embodiment.
FIG. 3B shows a schematic cross-sectional view of the polycrystalline silicon structure of the gate electrode structure along the line A-A from FIG. 3A, and FIGS. 4-16 show schematic cross-sectional views of a portion of the semiconductor device in different process acts of a method for producing the semiconductor device in accordance with one example embodiment.

FIG. 3B shows a sectional view along the line A-A in FIG. 3A. A boundary 22a of an active cell array of the IGFET 22, that is to say the transition between gate electrodes 62 and gate electrode contact-making region 64, runs along the line A-A. The boundary 22a encloses the active region of the IGFET 22. The active region of the IGFET 22 comprises the source regions 58 and the gate electrodes 62. In the example embodiment, the first trench 28 extends via a boundary 22a of the active cell array into the edge termination structure, that is to say the gate electrode contact-making region 64 of the IGFET 22. As shown in FIG. 3B, the semiconductor body 12 is both lowered and raised along the line A-A from FIG. 3A, that is to say along the boundary 22a, and lowered in the region of the gate electrode contact-making region 64. The source regions 58 are therefore provided in elongate webs 65 spaced apart from one another and extending from a bottom surface of the first trench 28 vertically in the direction of the first surface 14.

The gate electrodes 62 in the first trench 28 extend vertically into the semiconductor body 12 from the first surface 14 of the semiconductor body 12 and are electrically insulated from the semiconductor body 12 by the dielectric 40 acting as a gate dielectric. The source regions 58 adjoining the dielectric 40 and the gate electrodes 62 are electrically connected to the patterned wiring layer 52 via contact trenches 66, which extend through the insulation layer 36 into the semiconductor body 12 from the first surface 14 and are filled with a conductive layer of said patterned wiring layer 52. By applying a voltage to the gate electrodes 62, it is possible to control the conductivity in a channel region adjoining the gate dielectric by means of the field effect, such that it is possible to control a current flow between the source regions 58 and the common drain region 60. In addition to the source regions 58, a body region 68, which has a second charge carrier type opposite to the first charge carrier type, is also electrically contact-connected via the conductive layer in the contact-making trenches 66. Besides the contact trench arrangement for making the electrical contact with source and body as shown in FIGS. 1 and 2, alternatively other contact arrangements can also be used, e.g. a contact bearing on source and body.

The method for producing the gate electrode structure 20 of the vertical IGFET 22 and the semiconductor element 26 different from the gate electrode structure 20 of the vertical IGFET 22 in the semiconductor device 10 will be illustrated below with reference to FIGS. 4 to 16.

As shown in FIGS. 4 to 7, firstly in the semiconductor body 12 the first trench 28 for the gate electrode structure 20 of the vertical IGFET 22 is formed in the first part 18 and a second trench 30 for the semiconductor element 26 is formed in the second part 24. The formation of the first trench 28 and the second trench 30 should be understood to mean that at least one first trench 28 and at least one second trench 30 are formed in the semiconductor body 12. In this regard, the second trench 30 can be provided multiply depending on the number of semiconductor elements 26 in the second part 24 of the semiconductor device 10.

Figure 4:
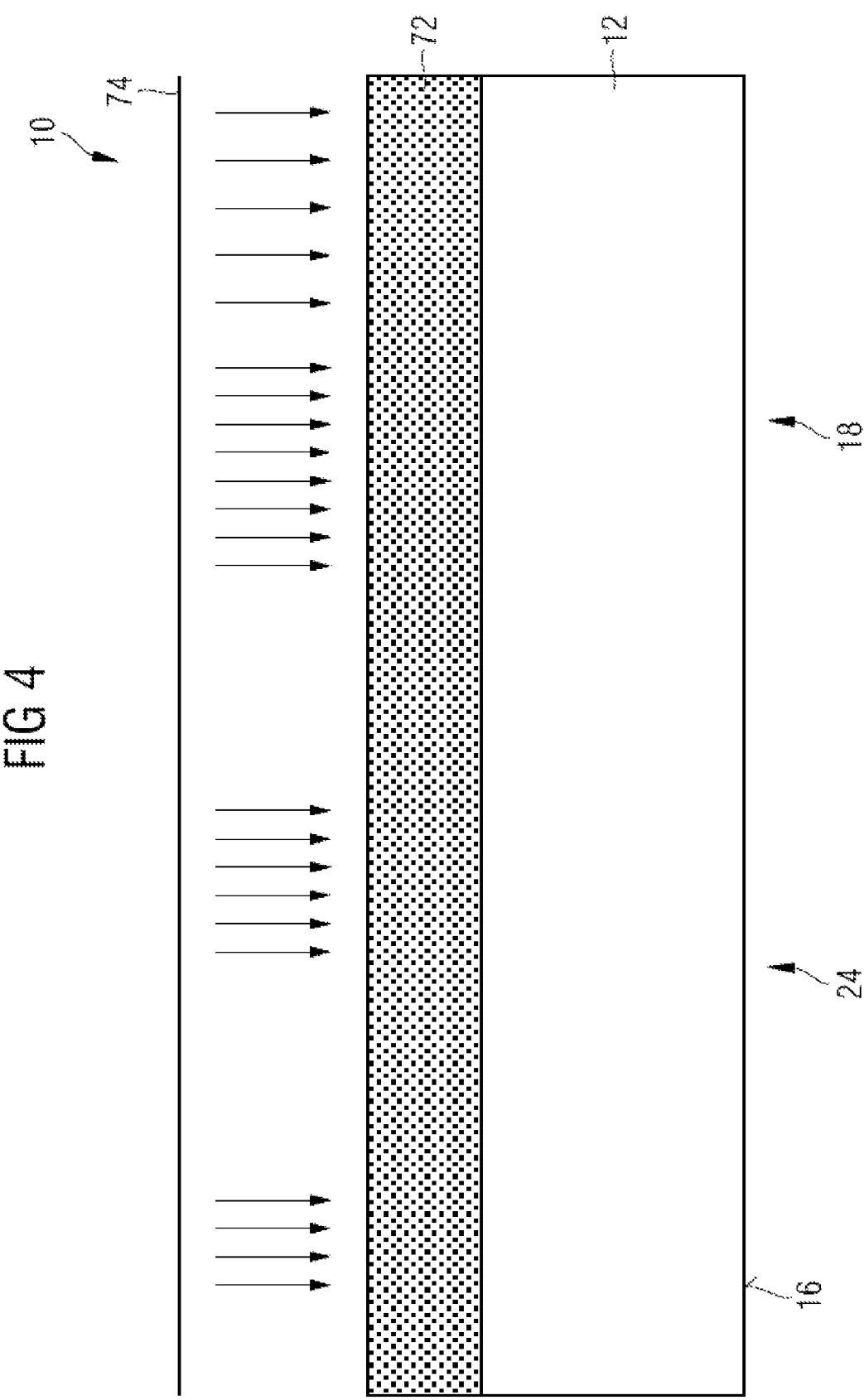
Figure 5:
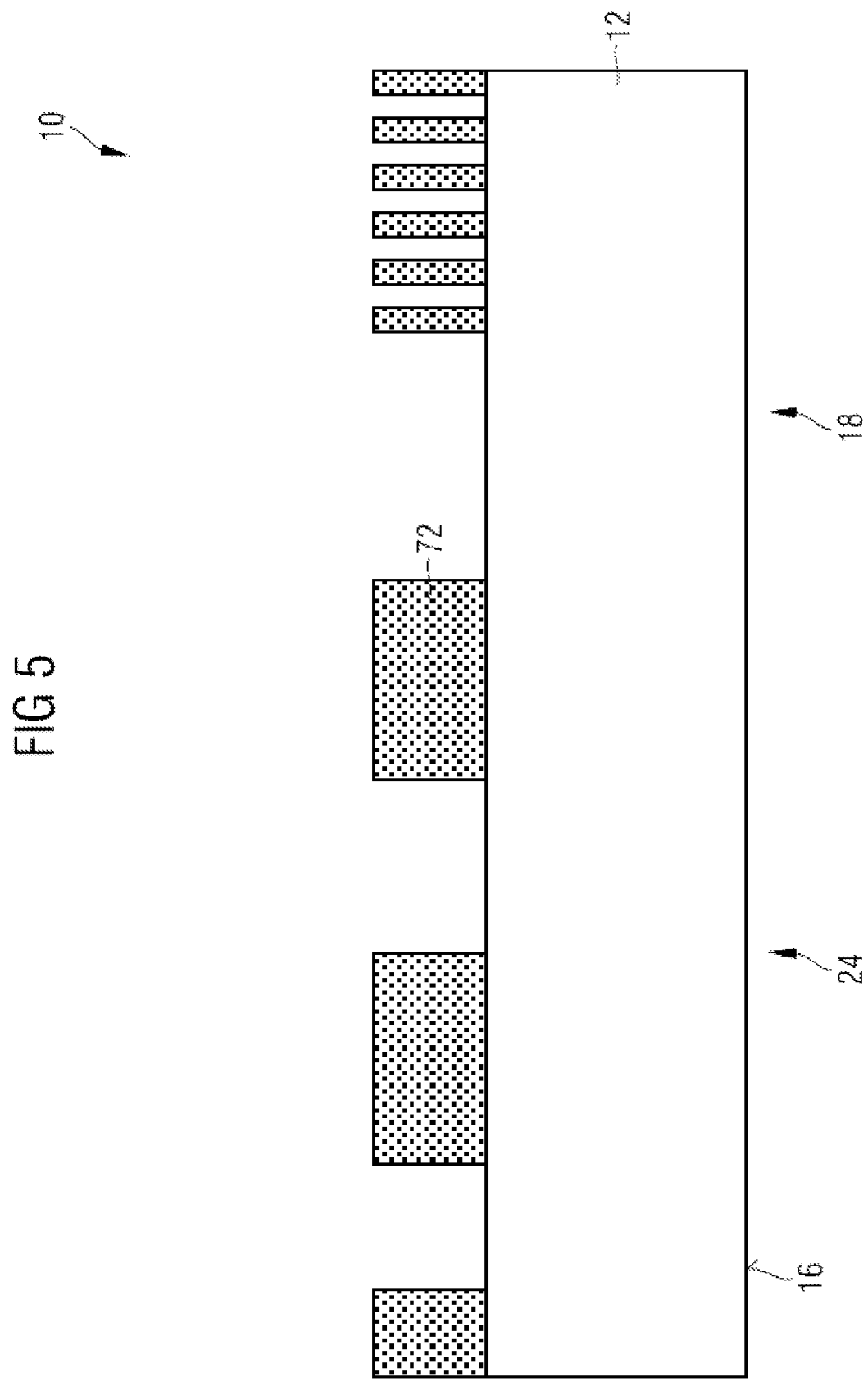
Figure 6:
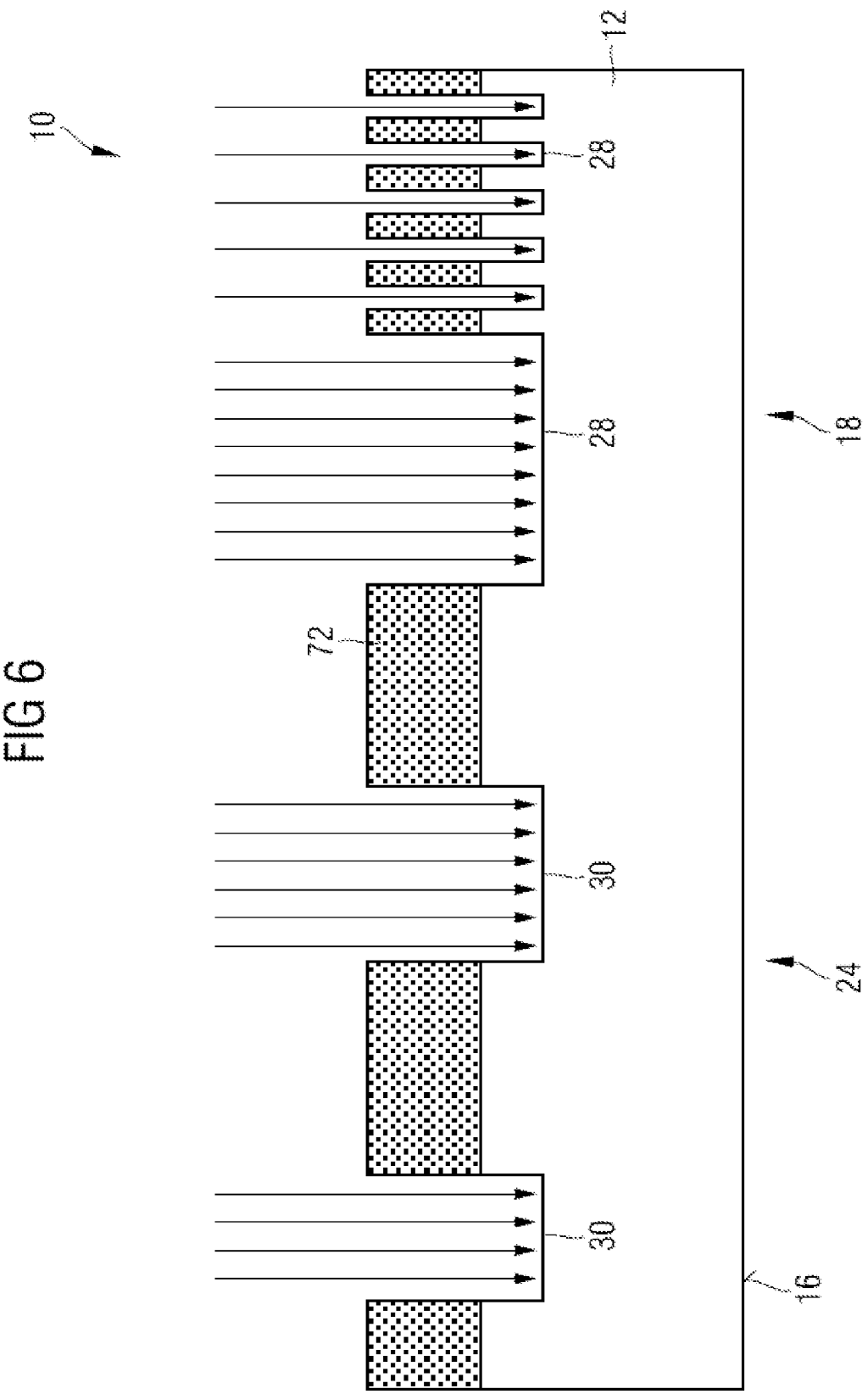

For the formation of the first trench 28 and the second trench 30, firstly, as shown in FIG. 4, a photoresist layer 72 is applied on the surface of the semiconductor body 12. In a subsequent mask step, the photoresist layer 72 is firstly exposed by means of a mask 74 and then developed in order to uncover surface regions of the semiconductor body (FIG. 5). In accordance with one example embodiment, a hard mask for the etching step to be carried out can also be produced by means of the mask step described above, when surface regions of the semiconductor body 12 that are to be etched are uncovered by the removal of the corresponding parts of the hard mask in a first etching step. The first trench 28 and the second trench 30 are then produced simultaneously by anisotropic etching of the semiconductor body 12 in the uncovered surface regions (FIG. 6).

Figure 7:
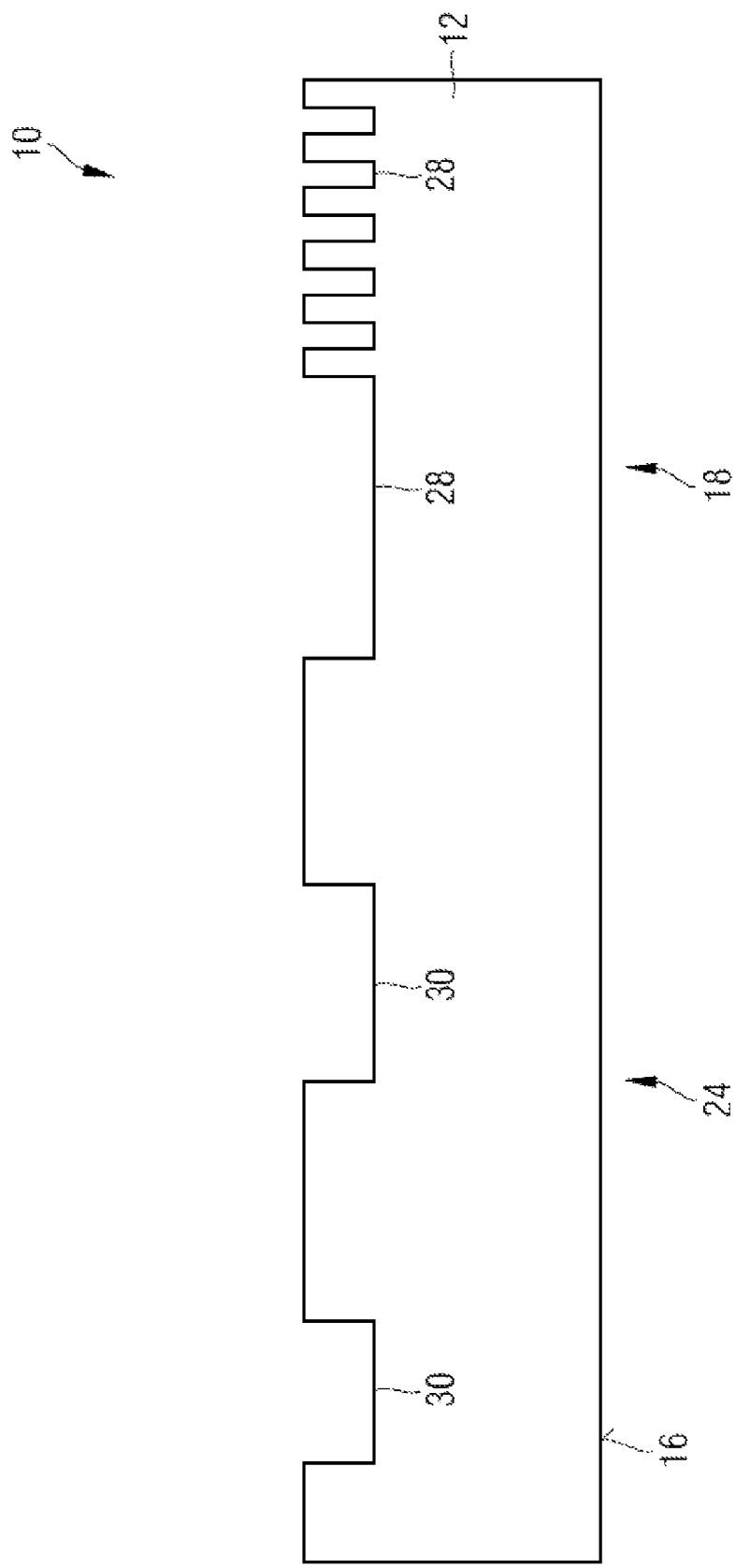

Since, in the anisotropic etching step, which can comprise reactive ion etching (RIE) in one embodiment, a material removal of the semiconductor body 12 depends on the width (or bottom area) of the trench to be etched, with wide trenches being etched more deeply than narrow trenches, the depths within the first trench 28 and the depths of the second trenches 30 differ in depth depending on their accessible bottom area. In this regard, the depth of the first trench 28 and of the second trench 30 deviate from one another by a maximum of 500 nm, for example. By using an etching method with little depth variation, it is possible for the range of fluctuation of the depths of the trenches to be reduced further, for example to values of 250 nm to 100 nm. Forming the trenches 28, 30 is followed by removing the mask 74 (FIG. 7).

Figure 8:
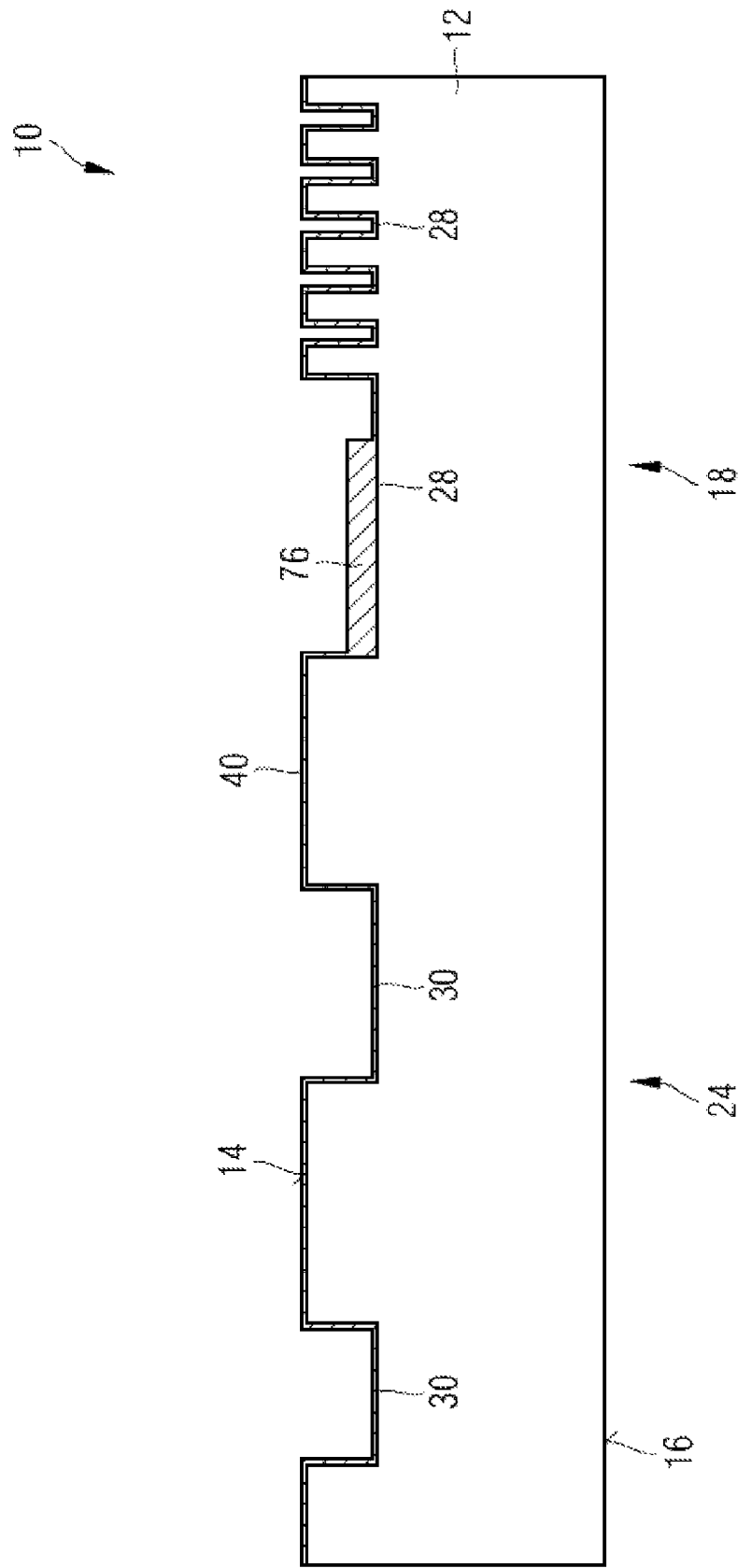

As shown in FIG. 8, after the first trench 28 and the second trench 30 have been formed, the dielectric 40 is formed on the surface of the semiconductor body 12, said dielectric lining the walls 42 of the first trench 28 and of the second trench 30 and being formed on the first surface 14 of the semiconductor body 12. With the use of silicon as semiconductor body 12, the dielectric 40 can be produced thermally as a silicon oxide layer, for example by dry oxidation. Additionally or alternatively, a dielectric can also be deposited, for instance by means of a method for conformal deposition such as low-pressure chemical vapor deposition (LPCVD). Besides the formation of a thermal oxide, by way of example, a wet oxidation step can additionally be carried out in order to produce regions of the dielectric 40 having an increased width. These regions 76 can be patterned even further by means of a mask step, for example.

Figure 9:
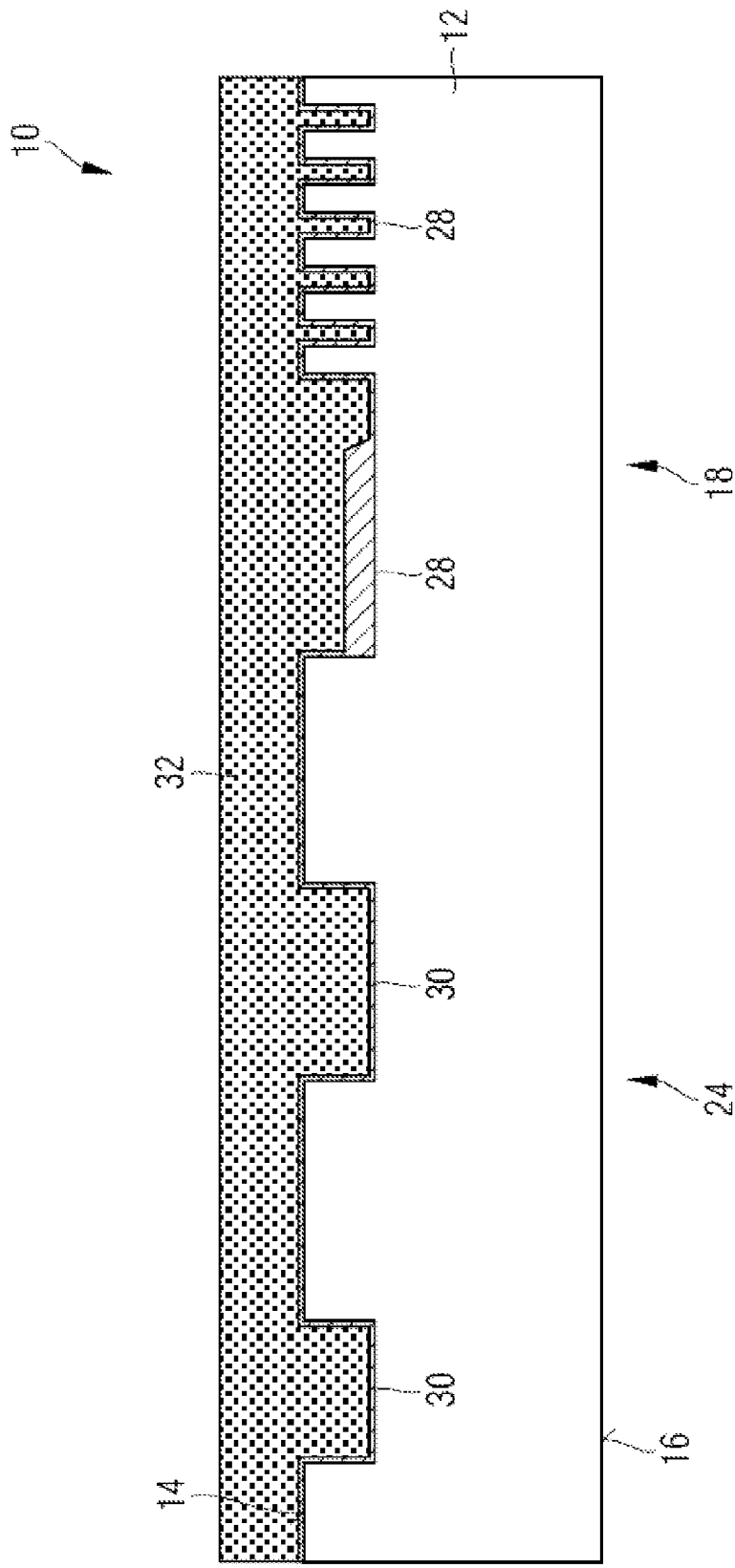

As shown in FIG. 9, polycrystalline silicon 32 is applied on the surface of the semiconductor body 12 until the first trench 28 and the second trench 30 are filled. The polycrystalline silicon 32 is therefore deposited on the surface of the semiconductor body 12 until all deposited polycrystalline silicon 32 projects beyond the top side of the dielectric 40 situated on the first surface 14. Therefore, only one common process of depositing polycrystalline silicon 32 is used for the formation of the polycrystalline silicon 32 in the gate electrodes 62, the gate electrode contact-making region 64, the diode 50 and the resistor 48 or a further semiconductor element 26.

Figure 10:
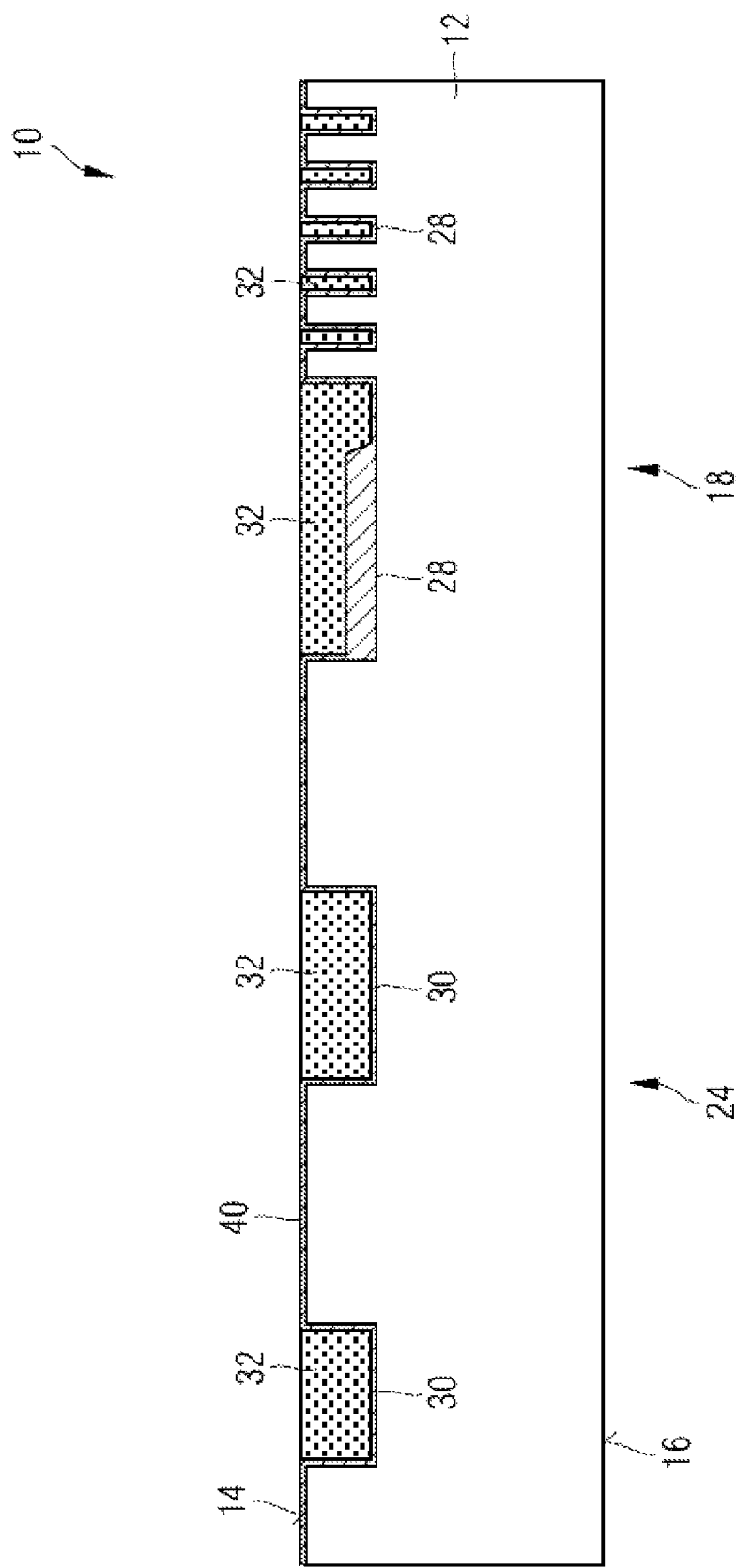

As shown in FIG. 10, after the application of polycrystalline silicon 32 on the surface of the semiconductor body 12, a chemical mechanical polishing step is carried out in order to remove polycrystalline silicon present above the first trench 28 and the second trench 30, such that the polycrystalline silicon 32 of the gate electrode structure 20 in the first trench 28 and the polycrystalline silicon 32 of the semiconductor element 26 in the second trench 30 are separated from one another.

In this case, the chemical mechanical polishing step uses the dielectric 40 formed on the first surface 14 of the semiconductor body 12 as a stop layer. On account of the chemical mechanical polishing step, a structure having a substantially planar surface arises, wherein the polycrystalline silicon 32 in the semiconductor element 26 and the gate electrode structure 20 can be electrically isolated from one another without a further mask step. By providing the at least one semiconductor element 26 within the second trench 30, therefore, it is possible to avoid further process steps for producing the semiconductor element in the wiring region by repeated deposition of polycrystalline silicon and for patterning the same. If, in contrast to the above description, the semiconductor elements comprising polycrystalline silicon are formed in the wiring region, then the surface of a semiconductor body to be processed has, after the formation of the polycrystalline silicon, a non-planar surface having elevated and depressed regions. Such a surface makes further lithographic steps and deposition processes more difficult, as a result of which the product yield is reduced.

Therefore, providing a chemical mechanical polishing step for separating the gate electrode structure 20 and the semiconductor element 26 both obviates a further mask step for forming component regions containing polycrystalline silicon and results in the provision of a planer topology after the formation of the active component region. The structures containing polycrystalline silicon and the trench structures are divided by means of a single mask step. Furthermore, the first surface 14 of the semiconductor body 12 with the dielectric 40 laying thereon acts as CMP endpoint identification and the formation of other endpoint identification auxiliary structures is rendered unnecessary.

Figure 11:
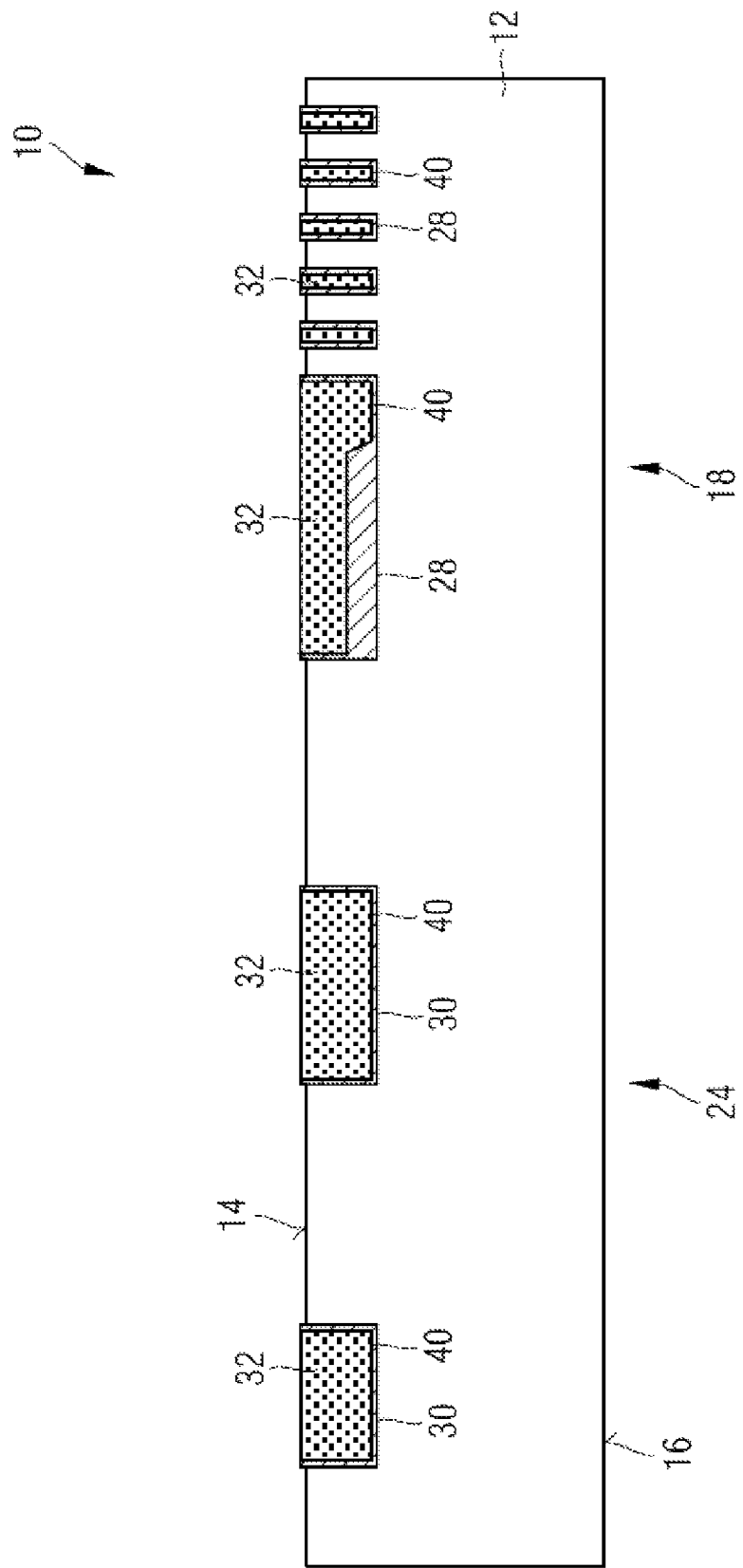
Figure 12:
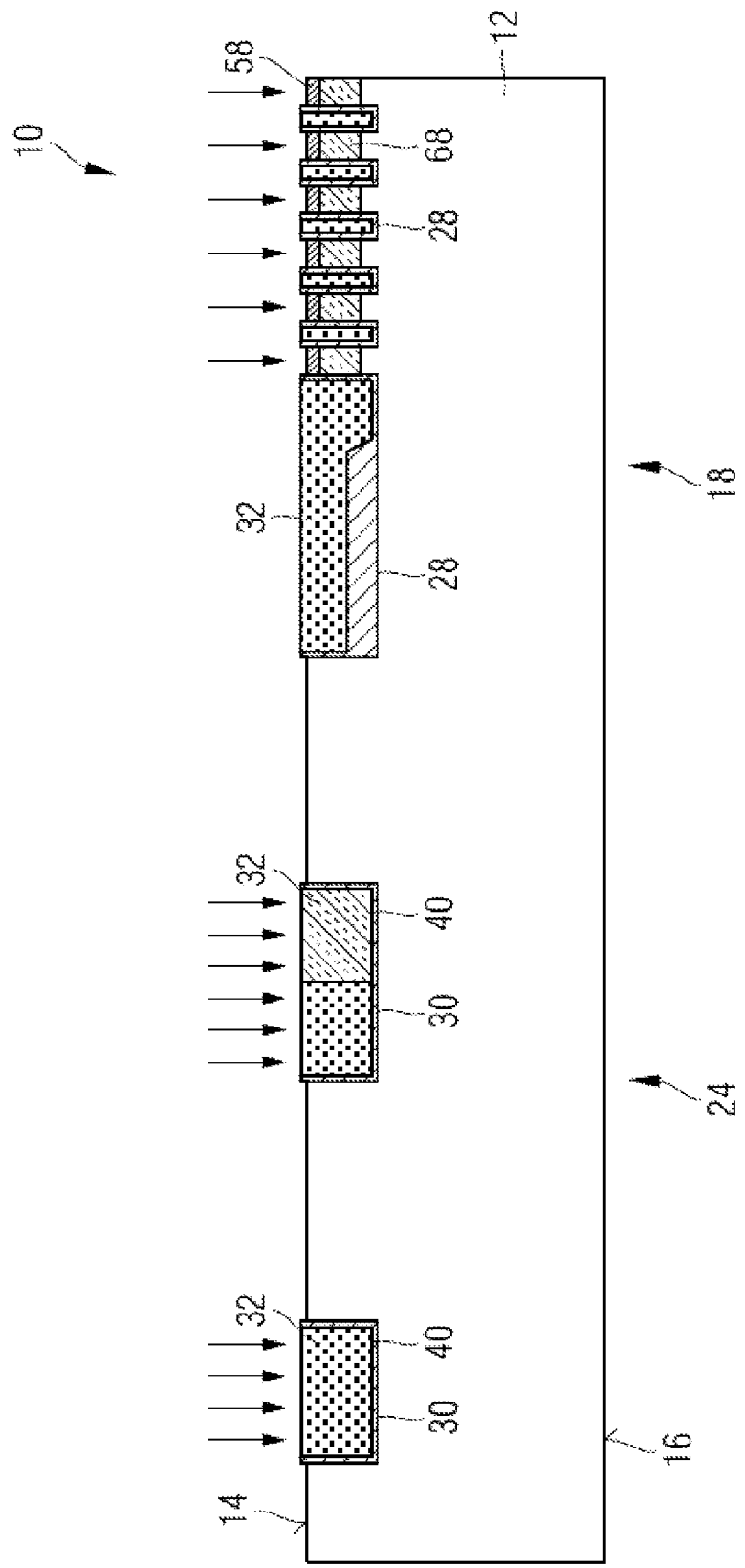

As shown in FIGS. 11 and 12, after the chemical mechanical polishing step has been carried out, the dielectric 40 situated on the first surface 14 of the semiconductor body 12 is removed and dopants are introduced in the polycrystalline silicon 32 in the second trench 30, in order to form different semiconductor elements 26 depending on the function.

The doping of the polycrystalline silicon can be carried out in situ during the filling of the trenches, followed by further doping steps, e.g. by means of implantation of dopants and/or diffusion from a dopant source, in order to redope or oppositely dope the polycrystalline silicon 32 already formed in parts, e.g. using masks, and thus to realize a desired diode function or resistor function. In this regard, in the example embodiment shown in FIG. 12, by way of example, a dopant of a first charge carrier type (for example n-type) is introduced in the first region 54 and a dopant of a second charge carrier type (for example p-type) is introduced in the second region 56, in order to form a diode structure. For simpler illustration, the requisite masks and separate implantation steps are replaced by arrows illustrated at the respective mask openings. For forming the diode, it is also possible to carry out only one doping step, e.g. implantation process, in order for instance to oppositely dope polycrystalline silicon doped in situ during production and thus to produce a pn junction. For forming the resistor 48, a dopant of one charge carrier type is introduced into the polycrystalline silicon 32 in order to form a resistor element depending on the required conductivity. When forming the resistor 48, a doping step downstream of the formation of the polycrystalline silicon can also be dispensed with, provided that a specific conductivity of the polycrystalline silicon that is set by in-situ doping is suitable for obtaining a desired resistance value by means of length and width variations of the dimensions of the resistor 48.

In the first part 18 of the semiconductor device 10, dopants of the first charge carrier type can be introduced into regions of the semiconductor body 12 which are adjacent to the first trench 28, in order to form the source regions 58. Furthermore, dopants of the second charge carrier type can be introduced into the semiconductor body 12 in order to form the body region 68 and possible body contact zones. However, the doped regions mentioned can also be provided as early as before the formation of the first trench 28. Besides the diode structure 50 or the resistor structure 48 shown in FIG. 12, even further semiconductor elements 26 such as, for example, a capacitor, an edge termination structure, a sensor structure such as, for example, a temperature sensor, a zap structure or else a lateral bipolar transistor structure can be formed in the second part 24 of the semiconductor device 10. A zap structure is a structure which can disconnect or establish electrical connections once by the application of a high voltage or a high current.

Figure 13:
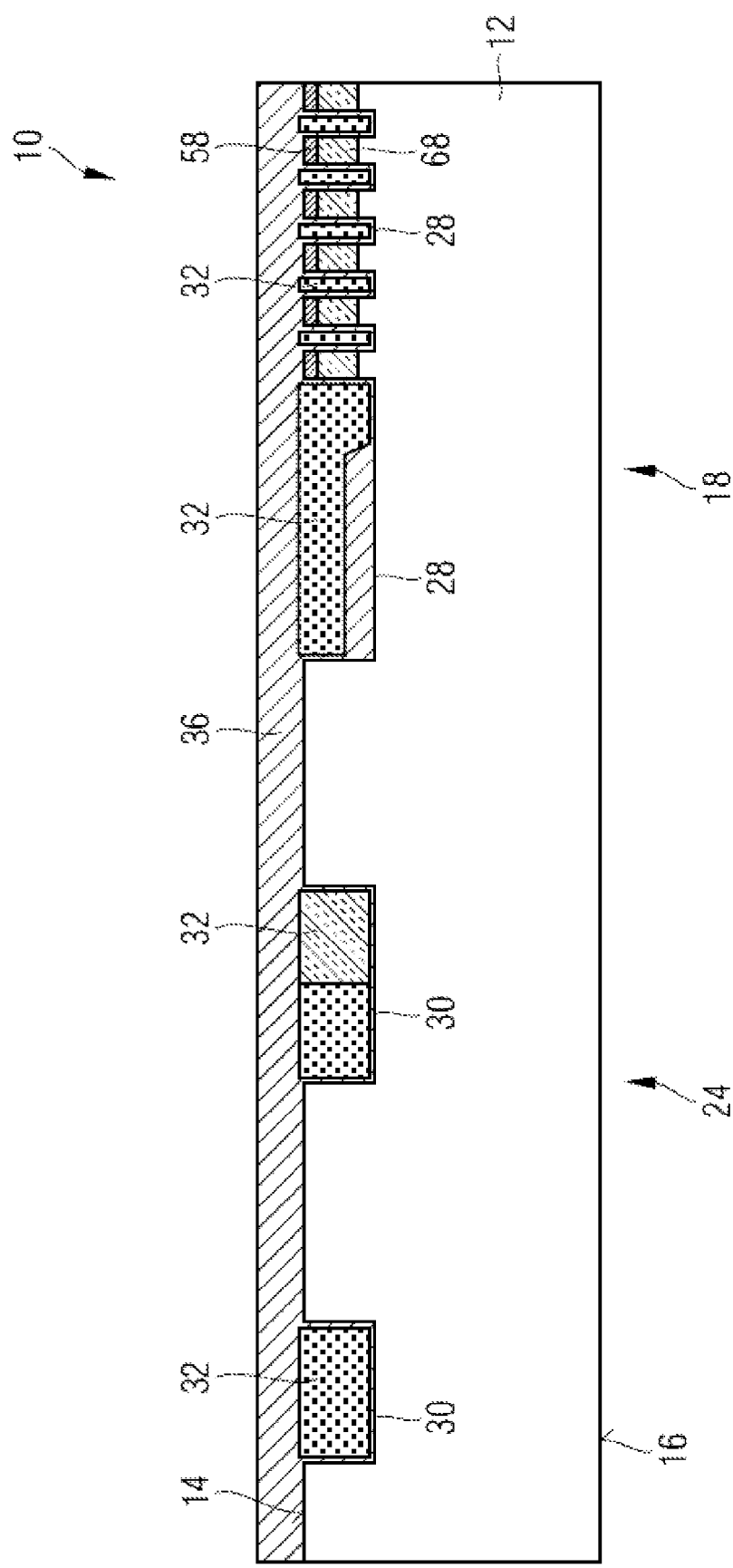

As shown in FIG. 13, after the formation of the doping regions in the polycrystalline silicon 32 and in the semiconductor body 12, the insulation layer 36 is formed on the first surface 14 of the semiconductor body 12. Since the insulation layer 36 is deposited after the chemical mechanical polishing step has been carried out, the insulation layer 36 has a substantially planer top side 34. The insulation layer 36 can be a silicon oxide layer or some other insulation layer comprising, for example, silicon nitride, siliconoxynitride, or a silicate glass such as borosilicate glass, phosphosilicate glass or borophosphosilicate glass.

Figure 14:
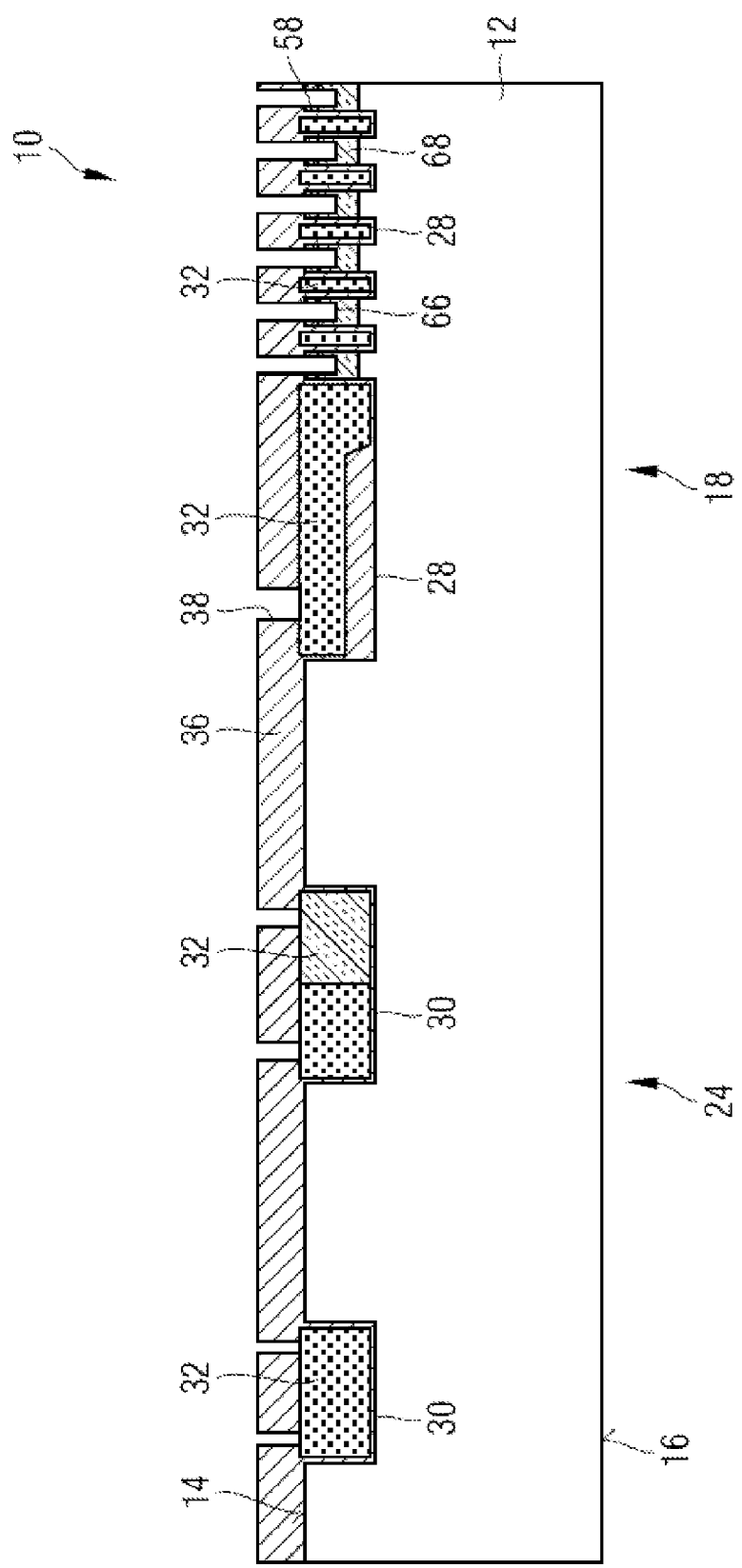

As shown in FIG. 14, contact holes 38 are formed in the insulation layer 36, said contact holes extending from the top side 34 of the insulation layer 36 through the latter to the polycrystalline silicon 32 in the first trench 28 and in the second trench 30. Furthermore, contact trenches 66 are formed in the first part 18 of the semiconductor device 10, said contact trenches extending through the source regions 58 into the body region 68 of the semiconductor body 12. However, it is also possible to realize the contact-connection of the body region 68 via a laterally adjacent planar contact without the formation of contact trenches 66.

Figure 15:
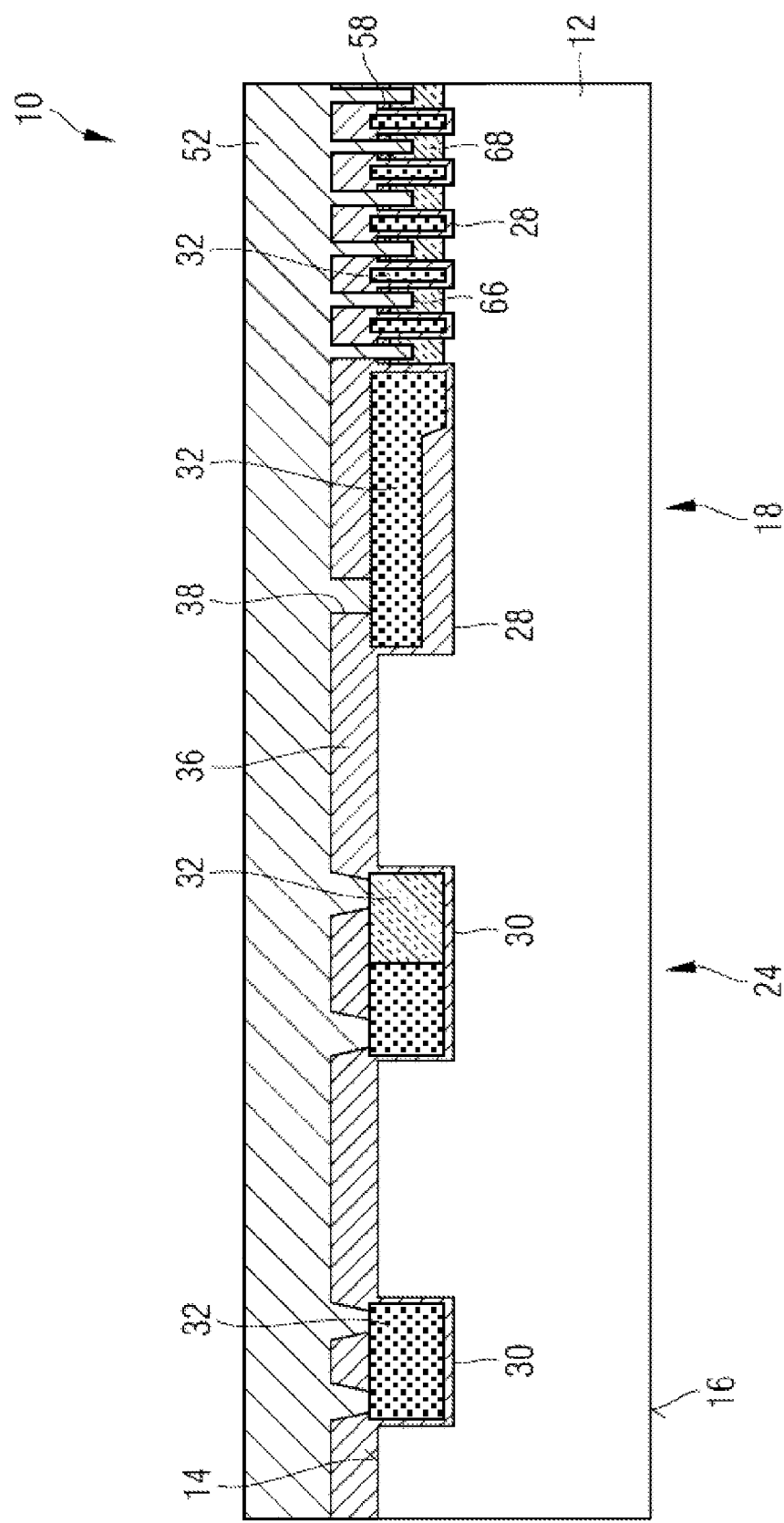

As shown in FIGS. 15 and 16, after the formation of the contact holes 38 and the contact trenches 66, a conductive layer is deposited in order to form a wiring layer 52. The conductive layer of the wiring layer 52 can be embodied as a single layer or a multilayer system and contain material constituents such as, for example, aluminum, copper or alloys composed of aluminum or copper such as, for example, AlSi, AlCu or AlSiCu. Alternatively or supplementarily, by way of example, single-layer or multilayer systems containing tungsten, nickel, titanium, silver, gold, platinum and/or palladium as material constituent can also be used as the conductive layer. The conductive layer of the wiring layer 52 lies on the substantially planar surface of the top side 34 of the insulation layer 36 and penetrates into the contact holes 38 and the contact trenches 66 such that the semiconductor element 26 and the gate electrode structure 20 are electrically contact-connected by means of a contact between the conductive layer of the wiring structure 52 and the polycrystalline silicon 32. Furthermore, through the contact trenches 66, the body region 68 and the source regions 58 are electrically connected to the wiring layer 52. The wiring layer 52 is finally patterned, as shown in FIG. 16, in order to achieve a selective electrical driving of the semiconductor elements 26, of the gate electrode structure 20 and of the source regions 58 and of the body region 68. Therefore, by forming the conductive layer, it is possible to achieve a contact-connection of the polycrystalline silicon 32 of the gate electrode structure 20 of the vertical IGFET 22 and of the polycrystalline silicon 32 of the semiconductor element 26.

Although the formation of a metallic wiring structure is shown in FIGS. 15 and 16, it is also conceivable, for example, to provide a further active component layer on the insulation layer 36, said further active component layer being connected to the component plane shown via the contact holes 38. In one example embodiment, however, any acts after carrying out the chemical mechanical polishing step are different from the step of applying polycrystalline silicon. In other words, after completion, the semiconductor device 10 has no polycrystalline silicon above the top side 34 of the insulation layer 36.

By means of the method for producing the semiconductor device 10, on account of carrying out the chemical mechanical polishing step, it is possible to electrically isolate polycrystalline silicon 32 in a semiconductor element 26 and in the gate electrode structure 20 and at the same time to set the height of the polycrystalline silicon in the gate electrodes 62 relative to the first surface 14, such that it is possible to dispense with a mask step for patterning the polycrystalline silicon and possible acts of etching back the polycrystalline silicon, the process-governed inaccuracy of which can lead, for example, to reliability fluctuations on account of threshold voltage shifts or dielectric strength fluctuations.

Thus, the method in accordance with one example embodiment does not comprise a conventional plasma or wet etching process for polycrystalline silicon, rather any polycrystalline silicon is removed by means of a chemical mechanical polishing step. This always involves removing a portion of polycrystalline silicon which has a smaller thickness than the thickness of the originally deposited polycrystalline silicon. The method in accordance with one example embodiment provides a structure which substantially provides a flat surface for forming an insulation layer 36 and the wiring layer 52 lying thereon. An edge termination structure lying below the semiconductor body surface can likewise be provided. On account of the formation of the semiconductor elements 26 and the gate electrode structure 20 of the vertical IGFET 22 in a simultaneously formed trench structure, which are electrically isolated by means of a CMP process, only an individual mask step is required for forming the gate electrode trenches and the trenches for the further semiconductor elements. Furthermore, in the case of the semiconductor device 10, contact can be made with the gate electrodes 66 by means of a gate electrode contact-making region 64 provided in the same trench structure as the gate electrodes 66, as a result of which an expedient electrical connection between gate electrode contact-making region 64 and gate electrodes 66 is provided. In the case of the semiconductor device 10, the polycrystalline silicon 32 of the gate electrode structure 20 and of the semiconductor element 26 has a planar surface that is substantially parallel to the first surface 14 and to the second surface 16, as a result of which the formation of further structures is simplified on account of the vertical self-alignment of the polycrystalline silicon 32 with respect to the semiconductor body 12.

The invention claimed is:

1. A semiconductor device, comprising:
a semiconductor body, having a first surface;
a gate electrode structure, which comprises polycrystalline silicon, of an insulated gate field effect transistor (IGFET) in a first trench extending from the first surface into the semiconductor body; and
a semiconductor element, which is electrically isolated from the gate electrode structure of the IGFET and comprises polycrystalline silicon, in a second trench extending from the first surface into the semiconductor body,
wherein the polycrystalline silicon of the IGFET and the polycrystalline silicon of the semiconductor element both end below a top side of an insulation layer, wherein the insulation layer adjoins the first surface of the semiconductor body, and
wherein the first trench extends via a boundary of an active cell array into an edge termination structure of the IGFET.

2. The semiconductor device as claimed in claim 1, wherein any polycrystalline silicon of the semiconductor device ends below the surface of the insulation layer adjoining the first surface of the semiconductor body.

3. The semiconductor device as claimed in claim 1, wherein the polycrystalline silicon of the IGFET and of the semiconductor element different therefrom extends maximally as far as the first surface of the semiconductor body.

4. The semiconductor device as claimed in claim 1, wherein the semiconductor element comprises a diode, a resistor, a capacitor, a sensor structure, a zap structure or an edge termination structure of the IGFET.

5. The semiconductor device as claimed in claim 1, wherein the gate electrode structure comprises a gate electrode and a gate electrode contact-making region laterally separated therefrom, which is in contact with a conductive layer below the top side of the insulation layer adjoining the first surface of the semiconductor body.

6. The semiconductor device as claimed in claim 1, wherein the polycrystalline silicon of the gate electrode structure of the IGFET in the first trench has a planar top side.

7. The semiconductor device as claimed in claim 1, wherein the polycrystalline silicon in the first trench and in the second trench in each case has a planar top side, the horizontal extents of which are offset maximally by 100 nm with respect to one another.

8. The semiconductor device as claimed in claim 7, wherein the planar top sides lie in a common plane.

9. The semiconductor device as claimed in claim 1, wherein the first trench and the second trench have depths which deviate from one another maximally by 250 nm.

10. The semiconductor device as claimed in claim 9, wherein the first trench and the second trench have different widths.

11. The semiconductor device as claimed in claim 1, furthermore comprising a dielectric, which lines the walls of the first trench and of the second trench, in order to electrically insulate the polycrystalline silicon in the first trench and the second trench from the semiconductor body.

12. The semiconductor device as claimed in claim 1, wherein the polycrystalline silicon of the semiconductor element and that of the gate electrode structure are deposited in a single step.

13. The semiconductor device as claimed in claim 1, wherein the polycrystalline silicon of the semiconductor element comprises additional dopants.

14. The semiconductor device as claimed in claim 1, wherein a conductive wiring layer abuts the semiconductor element.

15. The semiconductor device as claimed in claim 5, wherein the gate electrode contact-making region is wider than the gate electrode.

16. The semiconductor device as claimed in claim 6, wherein the gate electrode contact-making region is the edge termination structure.

17. A semiconductor device, comprising:
   a semiconductor body, having a first surface;
   a gate electrode structure, which comprises polycrystalline silicon, of an insulated gate field effect transistor (IGFET) in a first trench extending from the first surface into the semiconductor body; and
   a semiconductor element, which is electrically isolated from the gate electrode structure of the IGFET and comprises polycrystalline silicon, in a second trench extending from the first surface into the semiconductor body,
   wherein the polycrystalline silicon of the IGFET and of the semiconductor element different therefrom ends below a top side of an insulation layer adjoining the first surface of the semiconductor body,
   wherein the semiconductor element comprises a diode, a resistor, a capacitor, a sensor structure, a zap structure or an edge termination structure of the IGFET.

* * * * *